United States Patent
Zhang et al.

(10) Patent No.: US 10,250,788 B2
(45) Date of Patent: Apr. 2, 2019

(54) CAMERA MODULE WITH HEAT DISSIPATION ARRANGEMENT AND MANUFACTURING METHOD THEREOF

(71) Applicant: Ningbo Sunny Opotech Co., Ltd., Ningbo, Zhejiang (CN)

(72) Inventors: Baozhong Zhang, Ningbo (CN); Bojie Zhao, Ningbo (CN); Ye Wu, Ningbo (CN); Wei Guo, Zhejiang (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 0 days.

(21) Appl. No.: 15/127,412

(22) PCT Filed: May 13, 2014

(86) PCT No.: PCT/CN2014/077382
§ 371 (c)(1),
(2) Date: Sep. 19, 2016

(87) PCT Pub. No.: WO2015/143761
PCT Pub. Date: Oct. 1, 2015

(65) Prior Publication Data
US 2017/0134624 A1    May 11, 2017

(30) Foreign Application Priority Data
Mar. 25, 2014  (CN) .......................... 2014 1 0113453

(51) Int. Cl.
*H04N 5/225* (2006.01)
*G03B 17/55* (2006.01)
*H05K 3/22* (2006.01)

(52) U.S. Cl.
CPC .......... *H04N 5/2254* (2013.01); *G03B 17/55* (2013.01); *H04N 5/2253* (2013.01); *H04N 5/2257* (2013.01); *H05K 3/22* (2013.01); *G03B 2217/007* (2013.01)

(58) Field of Classification Search
CPC ..... H04N 5/2254; H04N 5/2253; G03B 17/55
USPC .......................................................... 348/340
See application file for complete search history.

(56) References Cited

FOREIGN PATENT DOCUMENTS

| CN | 102655714 A | * | 9/2012 | |
|---|---|---|---|---|
| CN | 102821239 A | * | 12/2012 | |
| CN | 103119510 A | * | 5/2013 | ........... G03B 17/002 |

* cited by examiner

*Primary Examiner* — Usman A Khan
(74) *Attorney, Agent, or Firm* — Raymond Y. Chan; David and Raymond Patent Firm

(57) ABSTRACT

A camera module includes an optical lens unit and a light sensing unit. The light sensing unit is provided along a light outgoing path of the optical lens unit so that the light sensing unit is able to sense light emitted from the optical lens unit. The light sensing unit further includes a photoelectric converting element and a conducting unit connected to the photoelectric converting element. The conducting unit transfers electrical signals converted and generated during operation of the photoelectric converting element, and conducts heat generated during operation of the photoelectric converting element outside.

8 Claims, 12 Drawing Sheets

CAMERA MODULE WITH HEAT DISSIPATION ARRANGEMENT AND MANUFACTURING METHOD THEREOF

CROSS REFERENCE OF RELATED APPLICATION

This is a non-provisional application that claims priority to international application number PCT/CN2014/077382, international filing date May 13, 2014, which claims priority to Chinese application number CN20140113453.5, filing date Mar. 25, 2014, the entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a camera module, and more particularly to a portable camera module incorporated in a mobile phone, a notebook computer, a tablet computer or the like, and also particularly to a method of manufacturing the camera module.

Description of Related Arts

Nowadays, with the miniaturization and flatness development of portable electronic devices such as mobile phones, tablet PCs, notebook computers and so on, all component installations thereof are required to be thinner and smaller. The camera, which is one of the common components normally equipped in the above electronic devices, is also required to be smaller and thinner. The camera module as the core component of the camera is also required to be thinner and smaller.

Currently, the camera module in many mobile phones has a thin metal sheet which is called a substrate by those skilled in the art. The thin metal sheet applying on the camera module in the mobile phone is first invented by the inventor of the present invention. The thin metal sheet applying on the camera module of the mobile phone has been widely used in the art, but few people can deeply understand its principles.

Why is a substrate required in camera module? The main reason is that a photosensitive unit of the camera module has evolved into an electronic photosensitive unit (the electronic photosensitive unit is commonly known as "chip" mainly including the CCD and the CMOS, the photosensitive unit converts the optical signals into electrical signals, and a circuit board transmits the electrical signals to a phone's CPU for signal processing, and then the electrical signals is converted into images on a phone screen which human eyes can identify). Since the photosensitive unit is a light sensing unit, the photosensitive unit must be aligned with the position of an optical lens and try not to be deflected. It is worth mentioning that the photosensitive unit is contacted to the circuit board. Since the circuit board is not flat and is easily deformed after heated, it will affect the photosensitive unit contacted on the circuit board, resulting in a deflection of the photosensitive unit relative to the optical lens. A flat member which has a rigid and large surface is needed to control the deformation of the circuit board. In addition, the metal made flat member has a good heat-conducting property. As a result, the metal sheet-shaped substrate is used in the camera module.

However, with the higher demands on the phone cameras, the cameras not only require good imaging quality but also configures to be lighter and thinner, so the photosensitive unit must be constantly improved to have better performance. However, during a process of photoelectric conversion, the photosensitive unit will generate a relatively large amount of heat, resulting in deformation in the internal of the circuit board when the lens is used for a long time. A conventional camera module as an example is illustrated as follows.

As shown in FIG. 1 of the drawings, the conventional camera module generally comprises a base 10', an optical lens unit 20' provided on the base 10', a substrate 30' provided under the base 10', a circuit board 40' provided on the substrate 30' and a photoelectric conversion element 50' provided on the circuit board 40' and under the optical lens unit 20'. Typically, the photoelectric conversion element 50' includes a CCD (Charge Coupled Device) or a CMOS (Complementary Metal-Oxide Semiconductor). The circuit board 40' is a flexible board or a rigid-flex circuit board.

As shown in the drawings, the circuit board 40' is overlapped on the substrate 30'. The photoelectric conversion element 50' is further overlapped on the circuit board 40'. In this way, there are the following problems. Firstly, as the circuit board 40' is generally not very flat, the photoelectric conversion element 50' is difficult to flatly overlap on the circuit board 40', thus the position of the photoelectric conversion element 50' will be deflected relative to the optical lens unit 20' and the imaging results quality will be affected. Secondly, the photoelectric conversion element 50' generates a huge amount of heat during operation, as the photoelectric conversion element 50' is located on the circuit board 40'. The heat is not easy to be dissipated to outside by the circuit board 40' and the circuit board 40' will be deformed after heated. The photoelectric conversion element 50' is further defected in relative to the optical lens unit 20' resulting in affection of the imaging results quality. If excessive heat is generated, the circuit board 40' may even be burned. Thirdly, as shown in FIG. 2 of the drawings, the photoelectric conversion element 50' is affixed to the circuit board 40' by glue and a thinker glue-layer is needed to be coated to overcome the non-flatten surface of the circuit board 40'. In other words, only the bulging portion of the circuit board 40' is contacted with the surface of the photoelectric conversion element 50', such that the circuit board 40' cannot securely couple to the photoelectric conversion element 50'. In order to firmly connect the surface of the circuit board 40' with the photoelectric conversion element 50', a thick glue-layer is filled at the gap between the circuit board 40' with the photoelectric conversion element 50'. Although the non-flatten problem between the circuit board 40' and the photoelectric conversion element 50' is solved, the glue-layer causes another problem. The thickness of the glue-layer increases a thickness of the overall camera module. Fourthly, normally the substrate 30' is made by a sheet-shaped element having a certain rigidity and a good heat-conductive performance, such that the circuit board 40' and the photoelectric conversion element 50' will have a flat surface corresponding. In addition, the heat emitted from the photoelectric conversion element 50' can be dissipated outside by the substrate 30'. However, as the circuit board 40' is provided between the photoelectric conversion element 50' and the substrate 30', the heat-conductive performance is limited. More seriously is that as the substrate 30', the circuit board 40' and the photoelectric conversion element 50' are connected to form a five-layer structure with two glue-layers. As a result, the heat-conductive performance of the substrate 30' is further limited.

SUMMARY OF THE PRESENT INVENTION

The invention is advantageous in that it provides a camera module, the camera module is thinner than a conventional camera module, such that the camera module of the present invention is specially designed for a miniaturization development trend of portable electronic devices.

Another advantage of the invention is to provide a camera module, the camera module has a better heat dissipating performance by changing overlapped modes of a light sensing unit, a circuit board and a substrate of the camera module.

Another advantage of the invention is to provide a camera module, wherein the light sensing unit of the camera module is flatten during a manufacturing process, and is configured to prevent internal deformation by heat during operation, so that the flatness of the light sensing unit is maintained.

Additional advantages and features of the invention will become apparent from the description which follows, and may be realized by means of the instrumentalities and combinations particular point out in the appended claims.

According to the present invention, the foregoing and other objects and advantages are attained by a camera module, comprising an optical lens unit and a light sensing unit provided along a light outgoing path of the optical lens unit so that the light sensing unit senses light emitted from the optical lens unit. The light sensing unit further comprises a photoelectric converting element and a conducting unit connected to the photoelectric converting element, wherein the conducting unit transfers electrical signals converted and generated during operation of the photoelectric converting element, and conducts heat generated during operation of the photoelectric converting element outside.

The present invention also provides a method of manufacturing a camera module, comprising the following steps.

(a) Provide a substrate which comprises a first platform surface and a second platform surface, wherein a height value from the first platform surface to the second platform surface of the substrate is larger than or equal to a thickness value of the circuit board.

(b) Overlap a circuit board on the first platform surface of the substrate 321 to make a conducting unit.

(c) Connect a photoelectric converting element to the conducting unit, wherein the photoelectric converting element is parallelly contacted with the second platform surface of the substrate and the photoelectric converting element is electrically coupled with the circuit board to make the light sensing unit.

(d) Assemble an optical lens unit with the light sensing unit by an optical axial of the optical lens unit being perpendicular to an outer surface of the photoelectric converting element to make the camera module.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1:
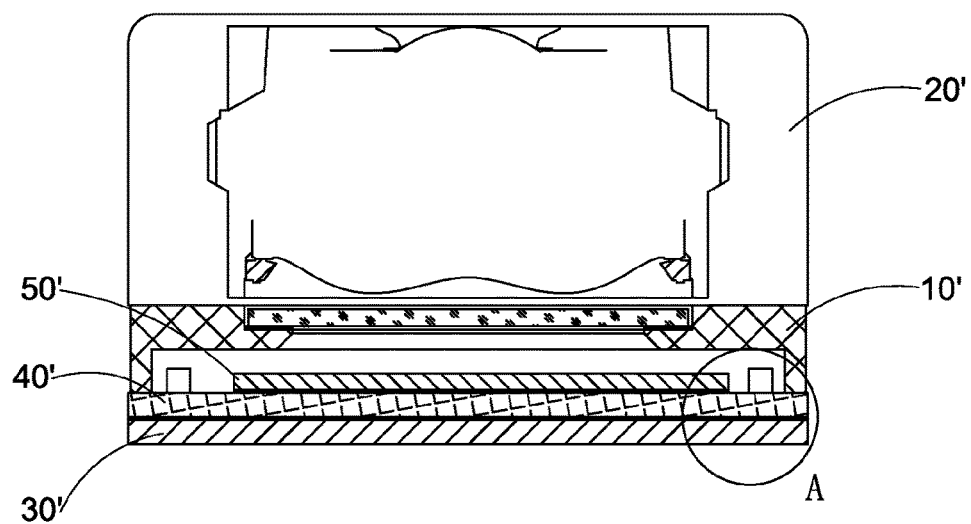
FIG. 1 is an enlarged cross-sectional view of a conventional camera module, illustrating an overlapping mode of a light sensing unit, a circuit board and a substrate of the conventional camera module.
Figure 2:
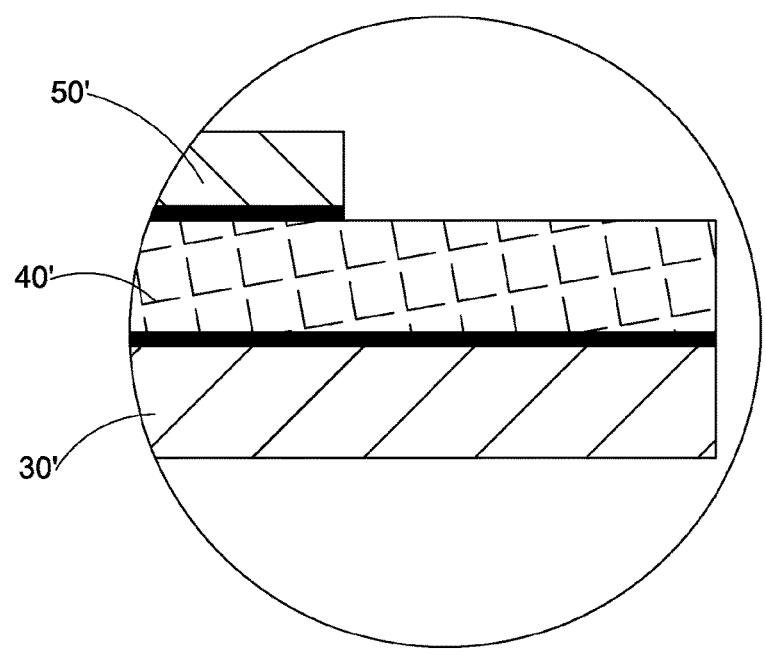
FIG. 2 is an enlarged cross-sectional view of a conventional camera module.
Figure 3:
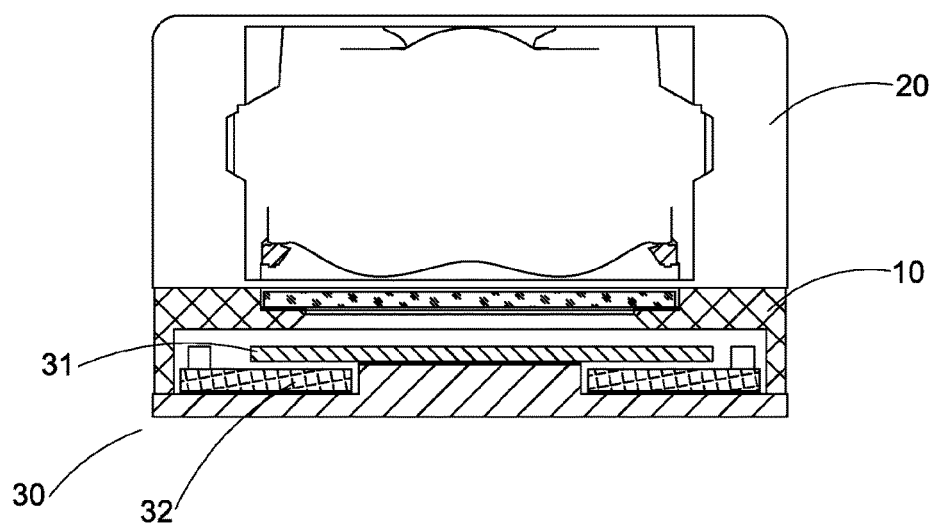
FIG. 3 is a cross-sectional view of a camera module according to a preferred embodiment of the present invention.
Figure 4:
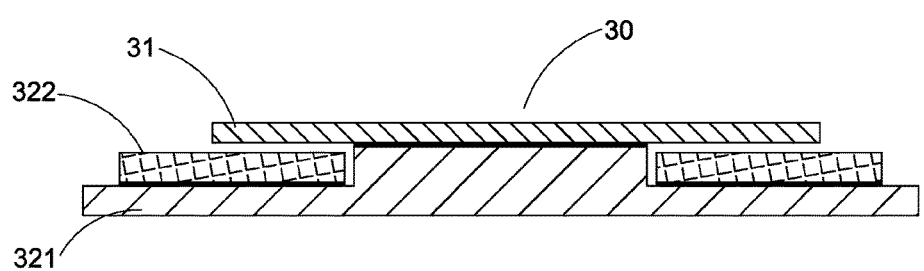
FIG. 4 is an enlarged cross-sectional view of the camera module according to the above preferred embodiment of the present invention, illustrating a structure of a light sending unit of the camera module.
Figure 5:
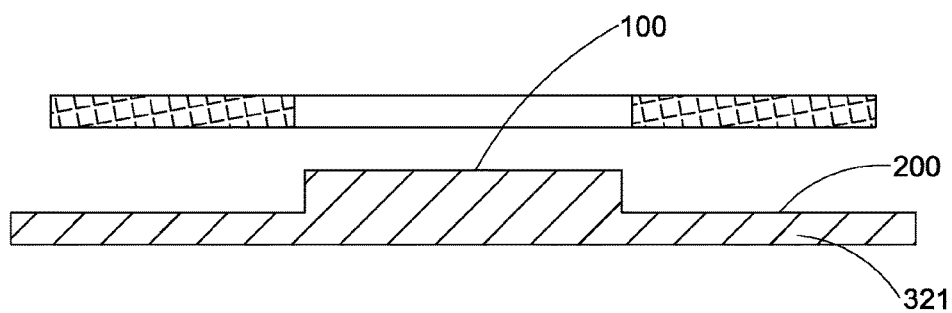
FIG. 5 is an enlarged cross-sectional view of the camera module according to the above preferred embodiment of the present invention, illustrating a structure of a conducting unit of the camera module.

Referring to FIG. 3 to FIG. 5 of the drawings, a camera module according to a preferred embodiment of the present invention is illustrated.

As shown in FIG. 3 of the drawings, a camera module of the present invention comprises a base 10, an optical lens unit 20 provided on the base 10, and a light sensing unit 30 provided at an inner side of the optical lens unit 20, wherein an optical axis of the optical lens unit 20 is perpendicular to a light incident surface of the light sensing unit 30. When the camera module is in a work state, the lights penetrate through the optical lens unit 20 and irradiate to the light incident surface of the light sensing unit 30. It is worth mentioning that the base 10 and the optical lens unit 20 are integrally formed or the light sensing unit 30 is integrally formed to be connected to the optical lens unit 20.

As shown in FIG. 4 of the drawings, the light sensing unit 30 further comprises a photoelectric converting element 31 and a conducting unit 32 connected to the photoelectric converting element 31. The conducting unit 32 transmits electric signals of the photoelectric converting element 31 to a processor of an electronic device for processing into images which human eyes can recognize, while the conducting unit 32 dissipates heat which produced by the photoelectric converting element 31 during working. Currently, the photoelectric converting element 31 which is also called imaging chips mainly comprises a CCD (Charge Coupled Device) or a CMOS (Complementary Metal-Oxide Semiconductor). It is worth mentioning that the optical axis of the optical lens unit 20 is primarily perpendicular to an outer surface of the photoelectric converting element 31.

As shown in FIG. 5 of the drawings, the conducting unit 32 further comprises a substrate 321 and a circuit board 322 provided on the substrate 321. The circuit board 322 generally is a flexible printed circuit board, or a rigid-flex board (which is also called a soft-hard board). The flexible printed circuit board and the rigid-flex board are convenient to be installed in a limited space. The substrate 321 is needed to meet three conditions, firstly, a thickness of the substrate 321 is very thin which has a range of 0.1 mm-0.4 mm; secondly, the substrate 321 is not easy to be deformed; thirdly, the substrate 321 is needed to have a good heat-conducting performance. Currently, the conventional substrate is generally made of stainless steel. It is worth mentioning that the substrate 321 provides a heat dissipating effect on the photoelectric converting element 31. The circuit board 322 is conducted the electric signals transmitted from the optical signals by the photoelectric converting element 31.

As shown in FIG. 5 of the drawings, the substrate 321 has a first platform surface 100 and a second platform surface 200 located above and parallel to the first platform surface 100, wherein the substrate 321 has a raised portion protruded from an upper side thereof that the first platform surface 100 is defined on the raised portion and the second platform surface 100 is defined on the upper side of the substrate. A height H, i.e. a distance, between the first platform surface 100 and the second platform surface 200 is equal to or higher than a thickness L of the circuit board 322. A lower surface of the circuit board 322 is contacted to the second platform surface 200 of the substrate 321. A usual method is affixing the lower surface of the circuit board 322 to the second platform surface 200 of the substrate 321 by glue. A lower surface of the photoelectric converting element 31 is contacted to the first platform surface 100 of the substrate 321. In order to better fix the photoelectric converting element 31, the lower surface of the photoelectric converting element 31 is affixed to the first platform surface 100 of the substrate 321 by glue. However, in order to better dissipate heat emitted from the photoelectric converting element 31 by the substrate 321, a contacted portion of the photoelectric converting element 31 and the first platform surface 100 of the substrate 321 does not need to be coated with a glue layer, instead, a joint part of the photoelectric converting element 31 and the circuit board 322 is affixed by glue.

Figure 6:
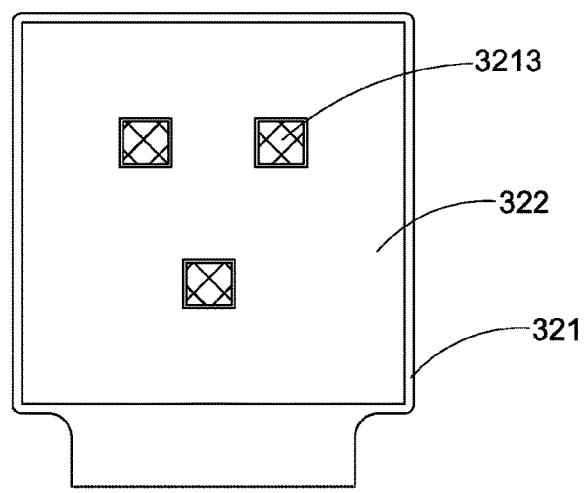
FIG. 6 and FIG. 7 are another alternative mode of a substrate and a circuit board of a camera module according to the above preferred embodiment of the present invention.
Figure 7:
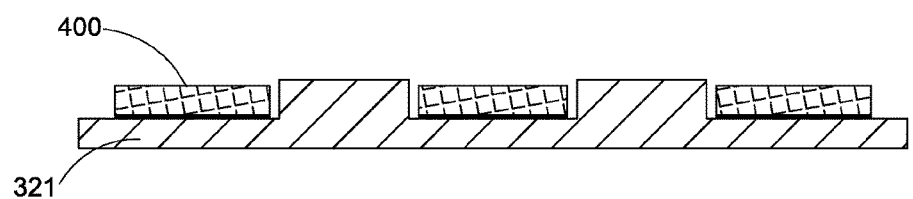

Accordingly, the structure of the conducting unit 32 is very different with the structure of the conventional camera module. The sheet-like substrate of the conventional camera module is overlapped with the sheet-like circuit board of the conventional camera modules. On the other hand, the substrate 321 of the conducting unit 32 of the present invention is embedded with the circuit board 322. In other words, the substrate 321 has one or more protrusions, as the raised portion, to define the first platform surface 100 thereon and the circuit board 322 has one or more through-holes 300. The protrusion of the substrate 321 is inserted into the through-hole 300 of the circuit board 322 in such a manner that the substrate 321 and the circuit board 322 are firmly combined and has a thinner combination which has a generally range of 0.1-0.4 mm. In other words, the thickness of the substrate 321 equals to the thickness of the conducting unit 32. In particular, as shown in FIG. 6 and FIG. 7 of the drawings, the substrate 321 has a plurality of protrusions 400 and correspondingly the circuit board 322 has a plurality of through-holes 300. It is appreciated that the circuit board 322 can have a larger sized through-hole 300 to receive the protrusions 400 or two or more smaller sized through-holes 300 which match with the number and shape of the protrusions 400 of the substrate 321 thereof in such a manner that the circuit board 322 and the substrate 321 are firmly and compactly connected so as to prevent the partial surface degumming of the substrate 321 due to the heat. In addition, it also prevents the deformation of the substrate 321 due to the compression of the photoelectric converting element 31 to cause the deflection of an outer surface of the photoelectric converting element 31 relative to the optical lens unit 20. In other words, if the circuit board 322 and the substrate 321 are not firmly connected, the optical axis of the optical lens unit 20 will not be properly aligned to perpendicular to the outer surface of the photoelectric converting element 31 and the imaging results of the camera module will be deteriorated. Preferably, the number and the shape of the through-holes 300 match with the number and the shape of the protrusions 400. In other words, the first platform surface 100 of the substrate 321 has a plurality of spaced apart surfaces.

More particularly, the structure of the light sensing unit 30 is different from the conventional light sensing unit. The conventional light sensing unit has a three-layer structure sequentially overlapped with a photoelectric conversion element, a circuit board and a substrate. Generally speaking, the conventional light sensing unit has a five-layer structure as glue layers are respectively provided between the photoelectric conversion element and the circuit board and between the circuit board and the substrate. Therefore, the conventional overall light sensing unit is relatively thick. In addition, the conventional light sensing unit has a relative poor heat conduction. During a manufacturing process, the flatness of the circuit board 322 is highly required. In the embodiment of the present invention, the substrate 321 of the light sensing unit 30 is penetrated through the circuit board 322 and directly contacted to the photoelectric converting element 31 to decrease the thickness of the overall light sensing unit 30 and to enhance a radiating heat efficiency. Moreover, the flatness of the circuit board 322 is not highly required and even the flatness of the circuit board 322 is not considered as long as the maximum thickness L is smaller than the height H of from the first platform surface 100 of the substrate 321 to the second platform surface 200. Preferably, the height H is larger than the thickness L in a range of 0~0.03 mm for adhesive coating.

Figure 8:
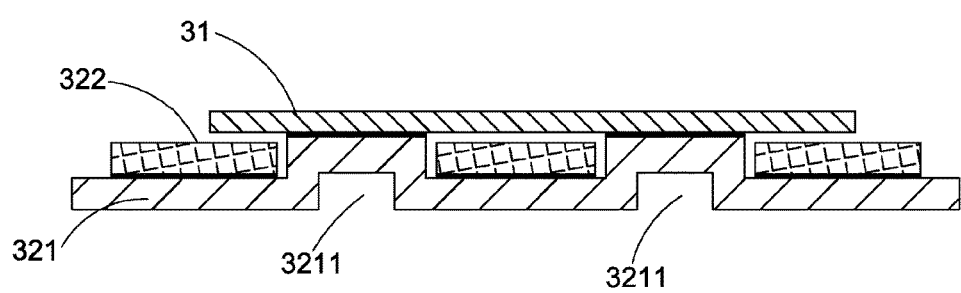
FIG. 8 is a cross-sectional view of the substrate of another alternative mode according to the above preferred embodiment of the present invention.

It is worth mentioning that in order to improve a heat dissipation efficiency, the heat dissipating area of the substrate 321 is increased, a specific mode is shown in FIG. 8 of the drawings, a bottom of the substrate 321 is provided with at least one heat dissipating groove 3211.

Figure 9:
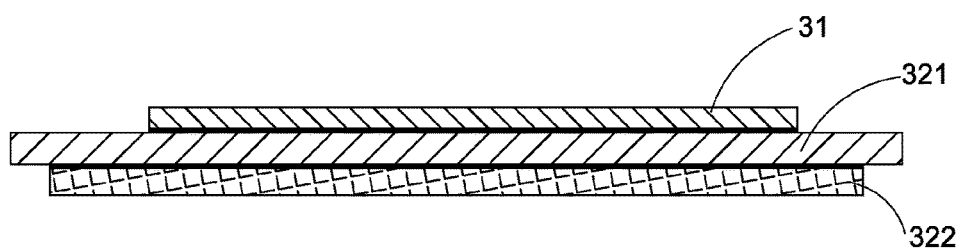
FIG. 9 is a cross-sectional view of the light sensing unit of another alternative mode according to the above preferred embodiment of the present invention.

It is worth mentioning that the light sensing unit 30 has an alternative structure. As shown in FIG. 9 of the drawings, the substrate 321 is provided between the photoelectric converting element 31 and the circuit board 322. In other words, the circuit board 322 is electrically coupled to the photoelectric converting element 31 by the substrate 321 in such a manner that the heat generated from the photoelectric converting element 31 is directly conducted by the substrate 321, and the substrate 321 will not be deformed by the heat generated from the photoelectric converting element 31, so that the position of the photoelectric converting element 31 will not be deflected relative to the optical lens unit 20 by the heat distortion of the substrate 321, thus ensuring that the overall camera module will not have a deteriorated imaging results resulting from the heating of the light sensing unit 30 during a normal working state.

Figure 10:
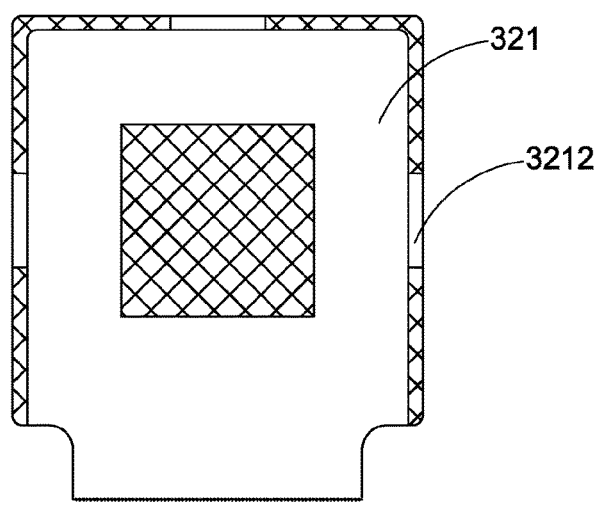
FIG. 10 is a perspective view of the substrate of another alternative mode according to the above preferred embodiment of the present invention.

It is worth mentioning that the substrate 321 further has a positioning portion 3212. As shown in FIG. 10 of the drawings, the positioning portion 3212 is provided on at least one edge of the substrate 321 for positioning the base 10 of the camera module. When the light sensing unit 30 is assembled with the base 10, the base 10 is aligned with the positioning portion 3212 of the base 10 and as a result the light sensing unit 30 is easily aligned with the optical lens unit 20, so that the imaging results quality of the overall cameral module is ensured as the optical axial of the optical lens unit 20 is easily perpendicular to the outer surface of the photoelectric converting element 31 of the light sensing unit 30, thus the overall imaging results quality of the camera module is ensured. It is worth mentioning that the positioning portion 3212 of the substrate 321 can be a positioning groove or a positioning tooth.

A method of manufacturing the camera module comprises the following steps.

(a) Provide the substrate 321 which has a first platform surface 100 and a second platform surface 200, wherein a height H from the first platform surface 100 to the second platform surface 200 of the substrate 321 is larger than or equal to a thickness L of the circuit board 322.

(b) Overlap the circuit board 322 on the first platform surface 100 of the substrate 321 to make a conducting unit 32.

(c) Connect the photoelectric converting element 31 to the conducting unit 32, wherein the photoelectric converting element 31 is parallelly contacted with the second platform surface 200 of the substrate 321 and the photoelectric converting element 31 is electrically coupled to the circuit board 322 to make the light sensing unit 30; and (d) Assemble the optical lens unit 20 with the light sensing unit 30 by an optical axial of the optical lens unit 20 being perpendicular to an outer surface of the photoelectric converting element 31 to make the camera module.

In the step (a) of the present invention, the step (a) further comprises a step (a1) of etching the substrate 321 in such a manner that the first platform surface 100 and the second platform surface 200 have an altitude intercept therebetween. More specifically, provide a flat stainless steel metal sheet having a thickness in a range of 0.1 mm~0.4 mm, and cover the second platform surface 200 using an erosion resistant coating and then etch regions around the second platform surface 200 in a predetermined area. The concentration and the etching time of the etchant solution is needed to be set in advance. It is worth mentioning that the first platform surface 100 and the second platform surface 200 of the substrate 321 can be stamped by laser cutting to form the altitude intercept between the first platform surface 100 and the second platform surface 200.

In the step (c) of the present invention, the photoelectric converting element 31 is contacted with the second platform surface 200 of the substrate 321. The primary meaning of "contact" refers to closely attach the photoelectric converting element 31 to the second platform surface 200 instead of affixing the photoelectric converting element 31 to the second platform surface 200 of the substrate 321 by glue. The fixation of the photoelectric converting element 31 can be implied by affixing the photoelectric converting element 31 to the circuit board 322 by glue, or the fixation of the photoelectric converting element 31 can be implied by attaching the side surface of the photoelectric converting element 31 to the second platform surface 200 by glue. In other words, the main purpose of contacting the photoelectric converting element 31 with the second platform surface 200 of the substrate 321 is directly connected the photoelectric converting element 31 with the substrate 321, so that the photoelectric converting element 31 not only refers to the flat substrate 321 to make the outer surface of the light sensing unit 30 more flatten, but also the heat generated from the photoelectric converting element 31 during the normal working state can be directly transmitted to outside by the substrate 321.

It is worth mentioning that in the step (d) of the method of manufacturing the camera module, the optical lens unit 20 is connected with the light sensing unit 30 by the base 10. More specifically, the optical lens unit 20 is mounted on the base 10, then the base 10 is affixed to the substrate 321 of the light sensing unit 30. Certainly, the base 10 also can be integrally formed with the light sensing unit 30 first, and then mount the optical lens unit 20 on the base 10 to make the overall camera module. Certainly, the base 10 is connected to the light sensing unit 30 can be implied by affixing the circuit board 322 to the substrate 321 at first and then affixing the base 10 to the surface of the circuit board 322 instead of directly affixing the base 10 to the substrate 321. Compared with directly affixing the base 10 to the substrate 321, it is advantageous that the size of the base 10 is decreased such that the size of the overall camera module is smaller relatively.

It is worth mentioning that the present invention provides a method of reinforcing the rigidity of a circuit board comprising the following steps.

(1) Provide the circuit board 322 having at least one through-holes 300.

(2) Provide the substrate 321 having at least one bulge 3213, i.e. the raised portion or the protrusion, wherein a size and a number of the bulges 3213 of the circuit board 322 are corresponding to the through-holes 300 thereof.

(3) Insert the bulges 3213 of the substrate 321 into the through-holes 300 of the circuit board 322 to connect the substrate 321 with the circuit board 322, and then coat glue in a connecting portion of the substrate 321 and the circuit board 322 in advance to firmly connect the substrate 321 with the circuit board 322, so that the rigidity of the circuit board 322 is reinforced.

It is worth mentioning that the conventional circuit boards reinforcing method is merely attaching a thin metal sheet to a surface of the circuit board by glue. The biggest problem of the conventional method is that once the circuit board is relatively thicker and after the circuit board is heated, the circuit board can be deformed due to the internal stress and resulting in a degumming problem which is the separation of the circuit board and the substrate. In the method of reinforcing the rigidity of the circuit board of the present invention, the circuit board and the substrate are not only combined in a transverse surface, but also are multi-point connected on edges based on the protrusions matching with the holes, so that the circuit board and the substrate are firmly and compactly connected.

It is worth mentioning that in the method of reinforcing the rigidity of the circuit board of the present invention, the circuit board 322 can be a metal sheet or other sheet-like members made of other materials, as long as the rigidity of the circuit board 322 is exceed to the rigidity of desired circuit board. As the substrate can be made of different materials, the substrate can be made by a variety of methods, such as molding, stamping, cutting, etching or the like.

It is worth mentioning that as shown in FIG. 5 of the drawings, the present invention also provides a method of flattening a light sensing unit. The core principle of flatten the light sensing unit is to minimum influences of other correlate elements on the photoelectric converting element 31 of the light sensing unit and to maintain a certain angle between the lights incident plane of the photoelectric converting element 31 and the optical axis of the optical lens unit 20. Currently the certain angle value is 90 degree. In other words, the lights incident plane of the photoelectric converting element 31 needs to be maintained perpendicular to the optical axis of the optical lens unit 20. The best method is to directly position and package the photoelectric converting element 31 and the optical lens unit 20, and then to connect with other elements such as circuit boards, capacitors and other components. However, if package the photoelectric converting element 31 with the optical lens unit 20 firstly, the connection of the terminals of the photoelectric converting element 31 and the circuit board 322 will be very difficult. As a result, the conventional method is to couple and overlap the circuit board 322 and the photoelectric converting element 31 together at first, and then package with the optical lens unit 20. However, as the rigidity and the flatness of the circuit board are far from requirements (because that the flatness of the rigid circuit board cannot easily to achieve and the manufacturing cost is high, and the rigidity of the flexible board is deficient), as a result, another substrate is needed to be connected. Certainly, the substrate also plays another role: when the photoelectric converting element 31 is welded to the circuit board 322, the substrate supports the circuit board to prevent the circuit board from being welded to wear.

The background art has been introduced that, in the conventional camera module, the photoelectric conversion element, the circuit board and the substrate of the conventional camera module are sequentially overlapped. As the circuit board is not flat itself, the conventional method is filling the bulges and grooves of the circuit board using glue. It not only enhances the thickness of the light sensing unit, but also result in an non-flatness of the photoelectric conversion element when the circuit board coated with glue is heated and deformed. The adjustment of the flatness is needed to refer to an item, and the non-flatness of the circuit board itself is needed to refer to the flatness of the substrate to be flatted when the circuit board is coated with the glue. In other words, in the conventional camera module technology, the circuit board is filled with the glue to be flatten. In the method of flattening the light sensing unit, the main principle is to minimize a surface contacting region of the surface of the photoelectric converting element 31 and the uneven surface of the circuit board 322 and to directly contact the surface of the photoelectric converting element 31 to the flat surface of the substrate 321. The method comprises the following steps.

(a) Provide the substrate 321 having a first platform surface 100 and a second platform surface 200 parallel to the first platform surface 100, wherein a height H from the first platform surface 100 to the second platform surface 200 is larger than or equal to a thickness L of the circuit board 322, which is H>L.

(b) Contact the circuit board 322 to the first platform surface 100 of the substrate 321, and directly contact the photoelectric converting element 31 to the second platform surface 200 of the substrate 321 referring to the first platform surface 100 and the second platform surface 200 in such a manner that the flatness of the circuit board 322 has no substantially effects on the flatness of the photoelectric converting element 31, as the substrate 321 is made of stainless steel sheet and has a good flatness, and the heat emitted from the photoelectric converting element 31 are not enough to make the substrate 321 be deformed, so that the flatness of the light sensing unit 30 during a manufacturing process in ensured and the heat emitted from the photoelectric converting element 31 do not damage the flatness of the light sensing unit 30 during a normal working state of the light sensing unit 30.

(c) Electrically couple the circuit board 322 with the photoelectric converting element 31.

Figure 11:
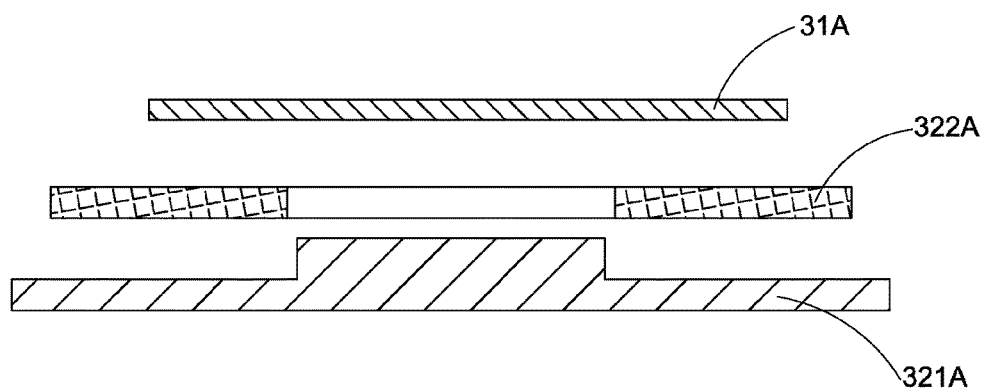
FIG. 11 is a perspective view of a heat-conductive structure of a chip according to the above preferred embodiment of the present invention.

It is worth mentioning that as shown in FIG. 11 of the drawings, the present invention also provides a heat-conductive method of a chip 31A, the heat-conductive method comprises the following steps.

(a) Provide a heat-conductive substrate 321A made of a sheet metal.

(b) Directly contact an outer surface of the chip 31A to a surface of the heat-conductive substrate 321A.

(c) Directly transfer heat emitted from the chip 31A by the heat-conductive substrate 321A.

It is worth mentioning that the heat-conductive method of the present invention further comprises a step (d) of processing the heat-conductive substrate 321A in advance and forming a first platform surface 100A and a second platform surface 200A on the heat-conductive substrate 321A, wherein a height H from the first platform surface 100A to the second platform surface 200A is larger than or equal to a thickness of a circuit board 322A, which is H>L, and provide the circuit board 322A on the first platform surface 100A of the heat-conductive substrate 321A, and provide the chip 31A on the second platform surface 200A of the heat-conductive substrate 321A, so that the chip 31A is directly contacted to the heat-conductive substrate 321A.

Figure 12:
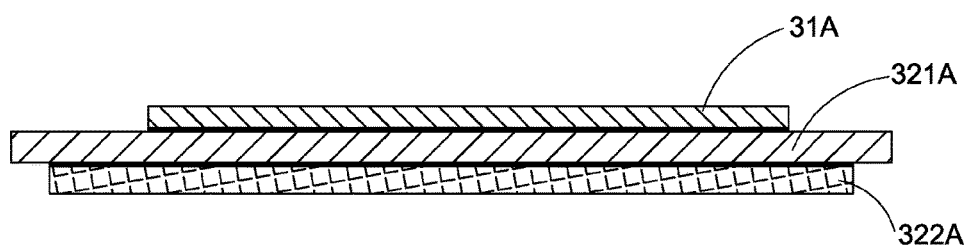
FIG. 12 is a perspective view of a heat-conductive structure of a chip according to another alternative mode of the present invention.

It is worth mentioning that the heat-conductive method of the present invention further comprises the step (b1) that, as shown in FIG. 12, directly contact the chip 31A to one side of the heat-conductive substrate 321A, and provide the circuit board 322A on other side of the heat-conductive substrate 321A, and the chip 31A is penetrated through the heat-conductive substrate 321A to couple with the circuit board 322A, so that the chip 31A is directly contacted to the surface of the heat-conductive substrate 321A.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A camera module, comprising:
an optical lens unit, and
a light sensing unit provided along a light outgoing path of said optical lens unit so that said light sensing unit is able to sense light emitted from said optical lens unit, wherein said light sensing unit comprises:
a photoelectric converting element, and a conducting unit connected to said photoelectric converting element, wherein said conducting unit transfers electrical signals converted and generated during an operation of said photoelectric converting element, and conducts heat generated during the operation of said photoelectric converting element to the surroundings, wherein said conducting unit comprises a substrate and a circuit board overlapped and contacted with said substrate at a position that said circuit board is positioned between said substrate and said photoelectric converting element, wherein said substrate is contacted with said photoelectric converting element for dissipating the heat from said photoelectric converting element during operation thereof, wherein said substrate has a raised portion and said circuit board has a through hole that said raised portion of said substrate is engaged and contacted with said through hole of said substrate to increase a heat dissipating area therebetween and to contact with said photoelectric converting element, wherein said substrate and said photoelectric converting element are closely attached to conduct the heat generated during operation of said photoelectric converting element, and said circuit board is electrically coupled with said photoelectric converting element to transfer electrical signals converted and generated during the operation of said photoelectric converting element.

2. The camera module, as recited in claim 1, wherein said substrate has a first platform surface and a second platform surface parallel to said first platform surface and a height between said first platform surface and said second platform surface is larger than or equal to a thickness of said circuit board, wherein said circuit board is contacted with said second platform surface of said substrate and said photoelectric converting element is contacted with said first platform surface of said substrate.

3. The camera module, as recited in claim 2, wherein said first platform surface of said substrate has a plurality of spaced apart surfaces.

4. The camera module, as recited in claim 1, wherein an outer side surface of said substrate is directly contacted with said photoelectric converting element and an inner side surface of said substrate is directly contacted with said circuit board, and a structure of said light sensing unit is sequentially overlapped and combined by said photoelectric converting element, said substrate and said circuit board.

5. The camera module, as recited in claim 2, further comprising a base integrally provided with said optical lens unit and said light sensing unit.

6. The camera module, as recited in claim 5, wherein said substrate further comprises a positioning portion calibrated and mounted with said base.

7. The camera module, as recited in claim 6, wherein said positioning portion of said substrate is a positioning groove.

8. The camera module, as recited in claim 1, wherein said substrate has a heat dissipating groove indently formed thereon a bottom side of said substrate.

* * * * *